(12) United States Patent
Tanaka et al.

(10) Patent No.: US 11,795,931 B2
(45) Date of Patent: Oct. 24, 2023

(54) FLUID CONTROL DEVICE

(71) Applicant: Murata Manufacturing Co., Ltd., Kyoto (JP)

(72) Inventors: Nobuhira Tanaka, Kyoto (JP); Masaaki Fujisaki, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 233 days.

(21) Appl. No.: 17/087,674

(22) Filed: Nov. 3, 2020

(65) Prior Publication Data

US 2021/0048013 A1 Feb. 18, 2021

Related U.S. Application Data

(63) Continuation of application No. PCT/JP2019/012660, filed on Mar. 26, 2019.

(30) Foreign Application Priority Data

May 31, 2018 (JP) .................................. 2018-104273
Jun. 25, 2018 (JP) .................................. 2018-119430
Jun. 25, 2018 (JP) .................................. 2018-119431

(51) Int. Cl.
*F04B 43/04* (2006.01)
*F04B 39/10* (2006.01)
(Continued)

(52) U.S. Cl.
CPC ............ *F04B 43/04* (2013.01); *F04B 43/046* (2013.01); *F04B 49/22* (2013.01); *F16K 7/17* (2013.01);
(Continued)

(58) Field of Classification Search
CPC ........ F04B 43/04; F04B 43/046; F04B 49/22; F04B 43/14; F04B 39/10; F04B 43/023;
(Continued)

(56) References Cited

U.S. PATENT DOCUMENTS 5,585,011 A 12/1996 Saaski et al.
7,195,393 B2 * 3/2007 Potter ................. F16K 99/0007
366/127
(Continued)

FOREIGN PATENT DOCUMENTS

CN 104121183 A 10/2014
CN 107923385 A 4/2018
(Continued)

OTHER PUBLICATIONS

Machine Translation of WIPO document WO 2016063710 A1 to Kawamura, retrieved from espacent on Jan. 19, 2023 (Year: 2023).*
(Continued)

*Primary Examiner* — Philip E Stimpert
*Assistant Examiner* — Dnyanesh G Kasture
(74) *Attorney, Agent, or Firm* — Pearne & Gordon LLP

(57) ABSTRACT

A fluid control device includes a valve, a pump and a film valve. The valve includes a first main plate, a second main plate, a first side plate, and a valve chamber. The first main plate has a first vent hole, and the second main plate has a second vent hole. The film valve is disposed in the valve chamber. The first vent hole is positioned in a central region of the valve chamber, and the second vent hole is positioned in an outer end region of the valve chamber. The film valve is positioned between the first vent hole and the second vent hole. The film valve is fixed to the second main plate in a state in which an end portion on a side of the outer end region or an end portion on a side of the central region is capable of vibrating.

22 Claims, 6 Drawing Sheets

(51) Int. Cl.
  *F16K 7/17*   (2006.01)
  *F16K 15/14*  (2006.01)
  *F04B 49/22*  (2006.01)
  *H10N 30/20*  (2023.01)
  *F16K 31/02*  (2006.01)
  *F04B 43/14*  (2006.01)

(52) U.S. Cl.
  CPC ......... *F16K 15/14* (2013.01); *H10N 30/2047* (2023.02); *F04B 43/14* (2013.01); *F16K 31/02* (2013.01)

(58) Field of Classification Search
  CPC .......................... F04B 45/047; F04B 53/1047; F04B 53/1075; F16K 7/17; F16K 15/14; F16K 31/02; F16K 15/18; F16K 15/16; H01L 41/0973
  USPC .......................... 137/855; 417/479, 545–554
  See application file for complete search history.

(56) References Cited

U.S. PATENT DOCUMENTS

| | | |
|---|---|---|
| 2010/0074775 A1 | 3/2010 | Yamamoto et al. |
| 2010/0215522 A1 | 8/2010 | Kawamura et al. |
| 2017/0218949 A1 | 8/2017 | Kokoi et al. |
| 2018/0187672 A1 | 7/2018 | Tanaka et al. |

FOREIGN PATENT DOCUMENTS

| | | | | |
|---|---|---|---|---|
| JP | S5861372 A | 4/1983 | | |
| JP | 2009074418 A | 4/2009 | | |
| JP | 2010223218 A | 10/2010 | | |
| JP | WO 2016063710 A1 * | 4/2016 | ........... | F16K 15/144 |
| JP | 2016113953 A | 6/2016 | | |
| WO | 2008090725 A1 | 7/2008 | | |
| WO | 2016013390 A1 | 1/2016 | | |
| WO | 2016063711 A1 | 4/2016 | | |
| WO | 2017038565 A1 | 3/2017 | | |

OTHER PUBLICATIONS

International Search Report issued in Application No. PCT/JP2019/012660, dated Jul. 2, 2019.
Written Opinion issued in Application No. PCT/JP2019/012660, dated Jul. 2, 2019.
Office Action for Chinese Patent Application No. 201980035476X dated Dec. 17, 2021.

* cited by examiner

FLUID CONTROL DEVICE

This is a continuation of International Application No. PCT/JP2019/012660 filed on Mar. 26, 2019 which claims priority from Japanese Patent Application No. 2018-104273 filed on May 31, 2018, and claims priority from Japanese Patent Application No. 2018-119430 filed on Jun. 25, 2018, and claims priority from Japanese Patent Application No. 2018-119431 filed on Jun. 25, 2018. The contents of these applications are incorporated herein by reference in their entireties.

BACKGROUND OF THE DISCLOSURE

Field of the Disclosure

The present disclosure relates to a fluid control device using a piezoelectric body.

Description of the Related Art

A fluid control device for conveying a fluid by using a piezoelectric body has been proposed as disclosed in Patent Document 1.

The fluid control device described in Patent Document 1 conveys a fluid by using the vibration generated by a piezoelectric body. In the valve chamber of the fluid control device, a flow-rectifying valve is formed so as to divide a valve chamber in up and down direction. The fluid in the valve chamber is conveyed in one direction by the vibration of the flow-rectifying valve.

Patent Document 1: International Publication No. 2016/63711

BRIEF SUMMARY OF THE DISCLOSURE

However, in the configuration of the fluid control device described in Patent Document 1, the flow-rectifying valve repeatedly collides with an opening edge in the valve chamber. This may cause the flow-rectifying valve to abrade and break.

Therefore, an object of the present disclosure is to provide a fluid control device having a flow-rectifying function and high reliability.

A fluid control device of the present disclosure includes a valve, a pump, and a valve body. The valve includes a first main plate, a second main plate having one main surface facing one main surface of the first main plate, and a first side plate connecting the first main plate and the second main plate. The valve has a valve chamber formed of the first main plate, the second main plate, and the first side plate. The first main plate has a first vent hole through which the inside and the outside of the valve chamber communicate with each other, and the second main plate has a second vent hole through which the inside and the outside of the valve chamber communicate with each other. The pump includes a diaphragm which is disposed to face another main surface of the first main plate and to which a piezoelectric element is disposed and a second side plate. The pump has a pump chamber formed of the first main plate, the diaphragm, and the second side plate. The pump chamber communicates with the valve chamber through the first vent hole. The valve body is disposed in the valve chamber.

The valve chamber includes a central region and an outer end region surrounding the central region when the one main surface of the second main plate is viewed from a front side of the one main surface of the first main plate. The first vent hole is positioned in the central region of the valve chamber, and the second vent hole is positioned in the outer end region of the valve chamber. Alternatively, the first vent hole is positioned in the outer end region of the valve chamber, and the second vent hole is positioned in the central region of the valve chamber. The valve body is positioned between the first vent hole and the second vent hole. The valve body is fixed to the first main plate or the second main plate in a state in which an end portion on a side of the outer end region or an end portion on a side of the central region is capable of vibrating.

In this configuration, the flow-rectification is performed by the vibration of the valve body, and since the valve body does not come into contact with the first vent hole and the second vent hole, it is possible to suppress the abrasion and breakage of the valve body. Therefore, the reliability is improved.

In addition, in the present disclosure, it is preferable that a coating agent be applied to a region, which faces a movable range of the valve body, in the first main plate or the second main plate.

In this configuration, the damage caused by a contact between the film valve and the first main plate or the second main plate is suppressed.

In addition, in the present disclosure, it is preferable that the Young's modulus of the coating agent be lower than the Young's modulus of the first main plate and the second main plate.

In this configuration, the impact when the film valve is brought into contact with the first main plate or the second main plate is alleviated, and it is possible to further suppress the damage to the film valve.

In addition, in the present disclosure, it is preferable that the valve body has a shape that allows switching between an aspect in which the end portion capable of vibrating contacts the first main plate or the second main plate to which the valve body is not fixed and an aspect in which the end portion capable of vibrating does not contact the first main plate or the second main plate to which the valve body is not fixed in accordance with pressure change in the valve chamber.

In this configuration, the end portion of the valve body capable of vibrating separates the central region and the outer end region in the aspect in which the end portion contacts the first main plate or the second main plate to which the valve body is not fixed, and the end portion of the valve body capable of vibrating allows the communication between the central region and the outer end region in the aspect in which the end portion does not contact the first main plate or the second main plate to which the valve body is not fixed. This improves the flow-rectifying effect.

Further, in the present disclosure, it is preferable that the length of a portion of the valve body capable of vibrating in a direction extending from the central region to the outer end region be larger than a distance between the first main plate and the second main plate.

In this configuration, it is easy to realize the aspect in which the end portion of the valve body capable of vibrating contacts the first main plate or the second main plate to which the valve body is not fixed.

In addition, in the present disclosure, it is preferable that the first vent hole be positioned in the central region, and the second vent hole be positioned in the outer end region.

In this configuration, the first vent hole is formed in a region where pressure change in the pump chamber is large. With this, it is possible to operate the valve body with a large pressure change.

In addition, in the present disclosure, it is preferable that the valve body be fixed to the first main plate or the second main plate in a state that the end portion on the side of the central region or the outer end region where the second vent hole is positioned is capable of vibrating.

In this configuration, the valve body operates to separate in a period in which the first main plate is coming close to the second main plate. Therefore, it is possible to improve the flow-rectifying function of the valve body by the change in the distance between the first main plate and the second main plate due to the vibration of the first main plate.

In addition, in the present disclosure, it is preferable that the valve body have an annular shape. In this configuration, it is possible to realize the valve body with a simple configuration while the above-described function of the valve body is realized.

According to the present disclosure, in a fluid control device having a flow-rectifying function, it is possible to achieve high reliability.

DETAILED DESCRIPTION OF THE DISCLOSURE

First Embodiment

Figure 1:
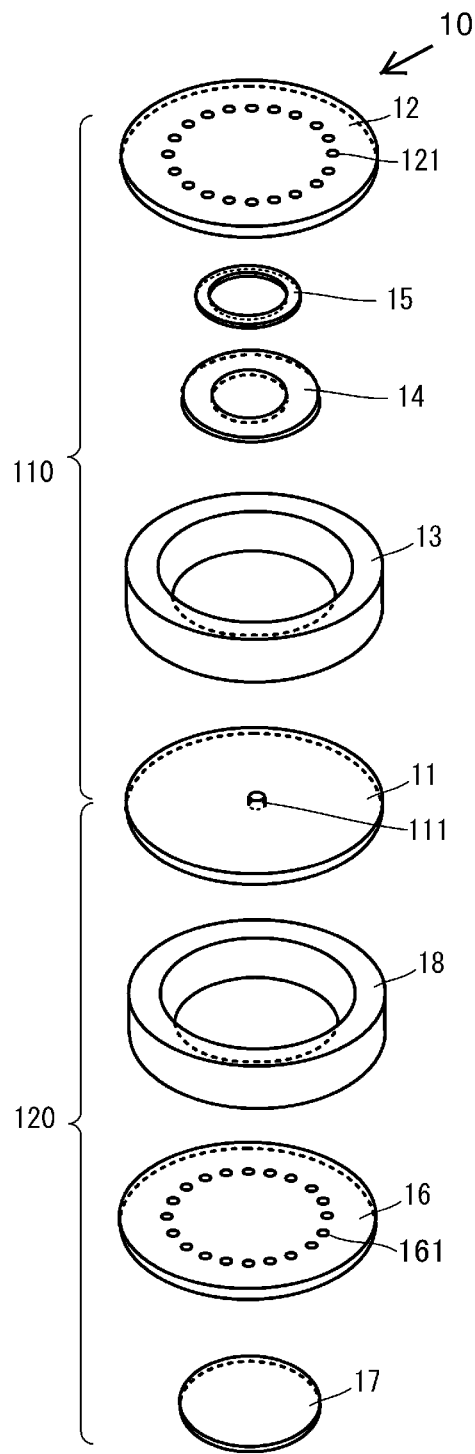
FIG. 1 is an exploded perspective view of a fluid control device 10 according to a first embodiment of the present disclosure.
Figure 2:
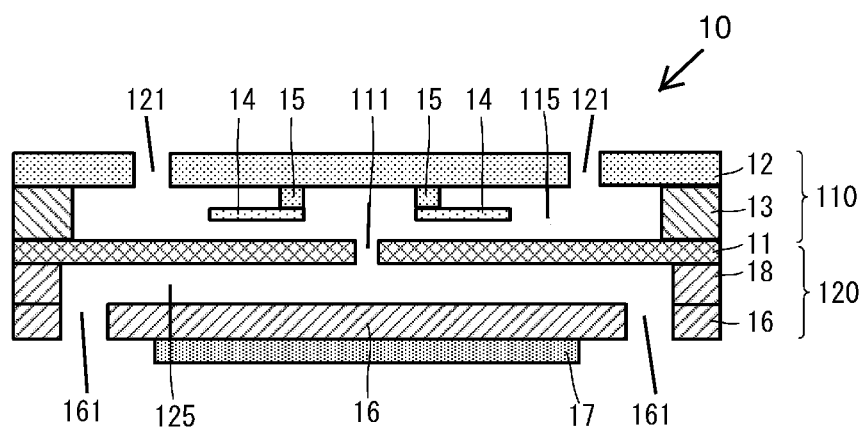
FIG. 2 is a sectional view illustrating a configuration of the fluid control device 10 according to the first embodiment of the present disclosure.

A fluid control device according to a first embodiment of the present disclosure will be described with reference to the drawings. FIG. 1 is an exploded perspective view of a fluid control device 10 according to the first embodiment of the present disclosure. FIG. 2 is a sectional view illustrating a configuration of the fluid control device 10 according to the first embodiment of the present disclosure. In each of the drawings illustrated in the following embodiments, the shapes of the respective components are partially or wholly exaggerated to facilitate the understanding of the description.

As illustrated in FIG. 1 and FIG. 2, the fluid control device 10 includes a valve 110 and a pump 120.

First, the structure of the pump 120 will be described. The pump 120 is formed with a first main plate 11, which constitutes the valve 110, as a constituent element thereof as illustrated in FIG. 1. The pump 120 is formed of the first main plate 11, a diaphragm 16, a piezoelectric element 17, and a second side plate 18.

The second side plate 18 has a cylindrical shape in plan view (front view) from a first main plate 11 side. The second side plate 18 is disposed between the first main plate 11 and the diaphragm 16, and connects the first main plate 11 and the diaphragm 16 to each other. More specifically, in plan view, the centers of the first main plate 11 and the diaphragm 16 coincide with each other. The second side plate 18 connects the first main plate 11 and the diaphragm 16, which are disposed in the above-described manner, in the peripheral end over the entire circumference.

In the diaphragm 16, a plurality of third vent holes 161 is formed so as to penetrate through the diaphragm 16. The plurality of third vent holes 161 are arranged in an annular shape at equal distances from the center of the diaphragm 16.

With this configuration, the pump 120 includes a pump chamber 125 formed of a hollow region surrounded by the first main plate 11, the diaphragm 16, and the second side plate 18. The pump chamber 125 is communicated with a first vent hole 111 and a third vent hole 161.

The piezoelectric element 17 is constituted of a disk-shaped piezoelectric body and an electrode for driving. The electrode for driving is formed on each of the main surfaces of the disk-shaped piezoelectric body.

The piezoelectric element 17 is disposed on a side of the diaphragm 16 opposite to a pump chamber 125 side, that is, on the outer side of the pump 120. In the above, the center of the piezoelectric element 17 and the center of the diaphragm 16 substantially coincide with each other in plan view.

The piezoelectric element 17 is connected to a controller that is not illustrated. The controller generates an alternating voltage and applies the alternating voltage to the piezoelectric element 17. As the result, since the piezoelectric element 17 expands and contracts, the diaphragm 16 performs flexural vibration. When the frequency of the alternating voltage applied to the piezoelectric element 17 is close to the resonant frequency of the fluid control device 10, the flexural vibration of the diaphragm 16 becomes large.

As described above, the flexural vibration of the diaphragm 16 causes the volume change of the pump chamber 125. Therefore, the pressure of the fluid in the pump chamber 125 changes. As the result, the inflow and outflow of the fluid are periodically repeated at the first vent hole 111 or the third vent hole 161.

Further, the flexural vibration of the diaphragm 16 is transferred to the first main plate 11 via the second side plate 18, and the first main plate 11 also performs flexural vibration. The first main plate 11 inversely vibrates in a direction in which the diaphragm 16 vibrates. That is, when the diaphragm 16 is deformed to the upward direction in the drawing, the first main plate 11 is deformed to the downward direction, and when the diaphragm 16 is deformed to the downward direction, the first main plate 11 is deformed to the upward direction. Since the volume change of the pump chamber 125 increases due to such flexural vibration of the first main plate 11, the inflow and outflow of the fluid through the first vent hole 111 or the third vent hole 161 increases.

The diaphragm 16 is stainless steel having an outer diameter of φ17 mm and a thickness of 0.4 mm, for example. The second side plate 18 is stainless steel having an outer diameter of φ17.7 mm, an inner diameter of φ13.1 mm, and a thickness of 0.2 mm. The first main plate 11 is stainless steel having an outer diameter of φ17 mm and a thickness of 0.45 mm. The frequency of the alternating voltage to be applied to the piezoelectric element 17 is 21 kHz. The diaphragm 16, the second side plate 18, and the first main plate 11 may be made of an aluminum alloy, a magnesium alloy, copper, or molybdenum.

Next, the structure of the valve 110 will be described. The valve 110 includes the first main plate 11, a second main plate 12, a first side plate 13, a film valve 14, and a bonding member 15. The film valve 14 corresponds to the "valve body" in the present disclosure.

As illustrated in FIG. 1, the first main plate 11 and the second main plate 12 have disk shapes. In addition, the first side plate 13 has a cylindrical shape. The second main plate 12 has an outer diameter of φ18 mm and a thickness of 0.15 mm, and the first side plate 13 has an outer diameter of φ17.5 mm and an inner diameter of φ13.5 mm, for example. The thickness of the first side plate 13 is preferably 120 μm or less, and more preferably 50 μm or less. In that case, opening and closing by the film valve is easy, and the flow-rectifying effect is improved. The second main plate 12 and the first side plate 13 are made of metal such as stainless steel, an aluminum alloy, a magnesium alloy, copper, and molybdenum, as with the first main plate 11, and have high rigidity.

The first side plate 13 is disposed between the first main plate 11 and the second main plate 12, and connects the first main plate 11 and the second main plate 12 so as to face the first main plate 11 and the second main plate 12. More specifically, the centers of the first main plate 11 and the second main plate 12 coincide with each other in plan view. The first side plate 13 connects the first main plate 11 and the second main plate 12, which are disposed in the above-described manner, in the peripheral end over the entire circumference.

The first main plate 11 is formed such that the first vent hole 111 penetrates through the substantial center of the first main plate 11. Note that a plurality of first vent holes 111 may be formed at the substantial center of the first main plate 11.

The second main plate 12 has second vent holes 121. The second vent holes 121 are formed so as to penetrate through the second main plate 12, and are formed in the vicinity of the outer ends of the second main plate 12 and apart from each other. In other words, the second vent holes 121 are formed in an annular shape over the entire circumference of the second main plate 12. Note that the number of the second vent holes 121 may be one formed in the vicinity of the outer end of the second main plate 12.

It should be noted that the first side plate 13 may be integrally formed with the first main plate 11 or the second main plate 12. That is, the first main plate 11 or the second main plate 12 may have a concave shape in which the center is recessed.

According to this configuration, the valve 110 includes a valve chamber 115 formed of a hollow region surrounded by the first main plate 11, the second main plate 12, and the first side plate 13. Further, the valve chamber 115 is communicated with the second vent holes 121 and the first vent hole 111.

The film valve 14 has an annular shape, and is disposed on a surface of the second main plate 12 on a valve chamber 115 side.

The film valve 14 is made of a material that is lightweight and flexible, such as a metal foil, a resin film, or the like. Note that, it is particularly preferable that the film valve 14 be a polyimide film because of high moisture resistance. The film valve 14 has a thickness of 5 μm, an outer diameter (diameter) of 5.9 mm, and an inner diameter (diameter) of 4.9 mm, for example.

The film valve 14 is bonded to the second main plate 12 by using the bonding member 15 having an annular shape. More specifically, the portion of the film valve 14 with a predetermined width in the inner end side of an annular shape is bonded to the second main plate 12 by the bonding member 15, and the region in the outer end side thereof is not bonded. That is, the film valve 14 is bonded to the second main plate 12 in a state in which the region with a predetermined area in the outer end side thereof is capable of vibrating. The bonding member 15 has an outer diameter of (p 5.5 mm, an inner diameter of (p 5.0 mm, and a thickness of 17 μm, for example.

It is preferable that the length L of the portion of the film valve 14 capable of vibrating in the direction from the central region toward the outer end region (length in the direction from the inner end side toward the outer end side) be equal to or larger than the distance D between the first main plate 11 and the second main plate 12 (distance between the main surfaces of the first main plate 11 and the second main plate 12 facing each other). This facilitates the contact of the outer end of the film valve 14 with the first main plate 11. Further, it is preferable to set the length L to be two times or more than the distance D, for example. This further makes it easy to achieve the aspect of contacting. Further, it is preferable to set the length L to be 50 times or less than the distance D, for example. This makes it easy to achieve the aspect of contacting and the aspect of not contacting. Note that in the aspect of contacting of the film valve 14, the distance D here may be set on the basis of the distance between the first main plate 11 and the second main plate 12 (the distance when the first main plate 11 and the second main plate 12 approach each other, for example) while considering the vibration state of the first main plate 11.

The first vent hole 111 is arranged in the central region surrounded by the outer end of the film valve 14 in plan view. The second vent holes 121 are arranged in an outer end region outside the outer end of the film valve 14 in plan view.

Figure 3A:
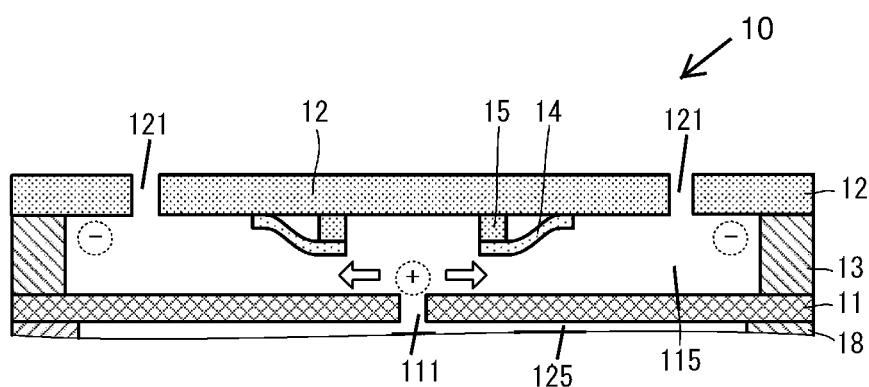
FIG. 3A and FIG. 3B are enlarged sectional views illustrating an operation of a film valve 14.
Figure 3B:
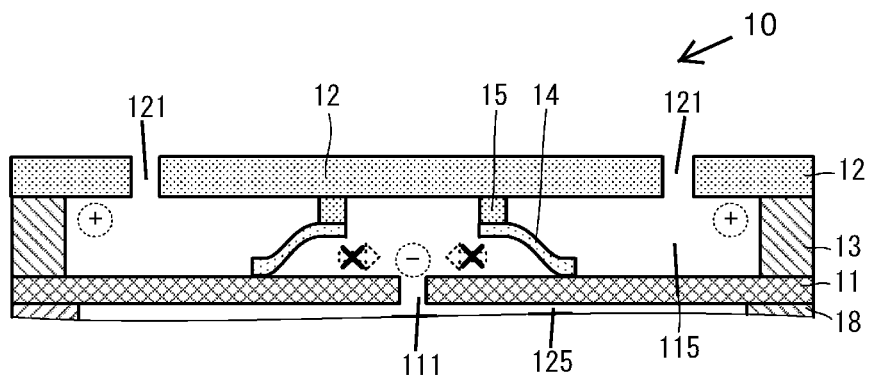

In the configuration above, the film valve 14 operates as follows in accordance with the flexural vibration of the diaphragm 16. FIG. 3A and FIG. 3B are enlarged sectional views illustrating the operation of the film valve 14. In FIG. 3A and FIG. 3B, the illustration of the displacement of the first main plate 11 is omitted.

(Central Region: Relatively High Pressure, Outer End Region: Relatively Low Pressure)

During the movement of the diaphragm 16 toward the pump chamber 125 side, that is, the period during which the diaphragm 16 and the first main plate 11 are approaching each other, the pressure in the vicinity of the first vent hole 111 increases. Consequently, as illustrated in FIG. 3A, the central region of the valve chamber 115 in plan view has a pressure (relatively high pressure) higher than that of the outer end region of the valve chamber 115.

In this case, as illustrated in FIG. 3A, the region in the outer end side of the film valve 14 curves toward a second main plate 12 side, and becomes spaced apart from the first main plate 11. With this, the central region and the outer end region of the valve chamber 115 communicate with each other, and the fluid accumulated in the central region is conveyed to the outer end region and discharged from the second vent holes 121.

At this time, since the film valve 14 is spaced apart from the first main plate 11, it does not hinder the conveyance of the fluid. Note that, although the fluid flows out through the third vent holes 161 in this period, the flow rate of the fluid flowing out is smaller than the flow rate of the fluid flowing in through the third vent holes 161 in the period of FIG. 3B which will be described later.

(Central Region: Relatively Low Pressure, Outer End Region: Relatively High Pressure)

During the movement of the diaphragm 16 toward the opposite side of the pump chamber 125, that is, the period during which the diaphragm 16 and the first main plate 11 are spaced apart from each other, the pressure in the vicinity of the first vent hole 111 lowers. Consequently, as illustrated in FIG. 3B, the central region of the valve chamber 115 in plan view has a pressure (relatively low pressure) lower than that of the outer end region of the valve chamber 115.

In this case, as illustrated in FIG. 3B, the region in the outer end side of the film valve 14 curves toward the first main plate 11 side, and contacts the surface of the first main plate 11. As the result, the central region and the outer end region of the valve chamber 115 are separated. Therefore, the backflow of the fluid from the outer end side to the central region is suppressed, and the fluid flows into the pump chamber 125 through the third vent holes 161. The flow rate of the fluid flowing in during this period is larger than the outflow rate from the third vent holes 161 in the period illustrated in FIG. 3A by the amount of decrease in the inflow through the first vent hole 111.

(Continuous Operation)

As described above, in the second vent holes 121, the outflow rate in the period illustrated in FIG. 3A is large, and the inflow rate in the period in FIG. 3B is small. Consequently, the fluid flows out through the second vent holes 121 by the continuous operation of the repetition of the period illustrated in FIG. 3A and the period illustrated in FIG. 3B.

On the other hand, as for the third vent holes 161, the outflow rate in the period illustrated in FIG. 3A is small, and the inflow rate in the period illustrated in FIG. 3B is large. Consequently, the fluid flows in through the third vent holes 161 by the continuous operation of the repetition of the period illustrated in FIG. 3A and the period illustrated in FIG. 3B.

With this, the fluid flows in through the third vent holes 161 and flows out through the second vent holes 121 by the continuous operation of the repetition of the period illustrated in FIG. 3A and the period illustrated in FIG. 3B.

Figure 4:
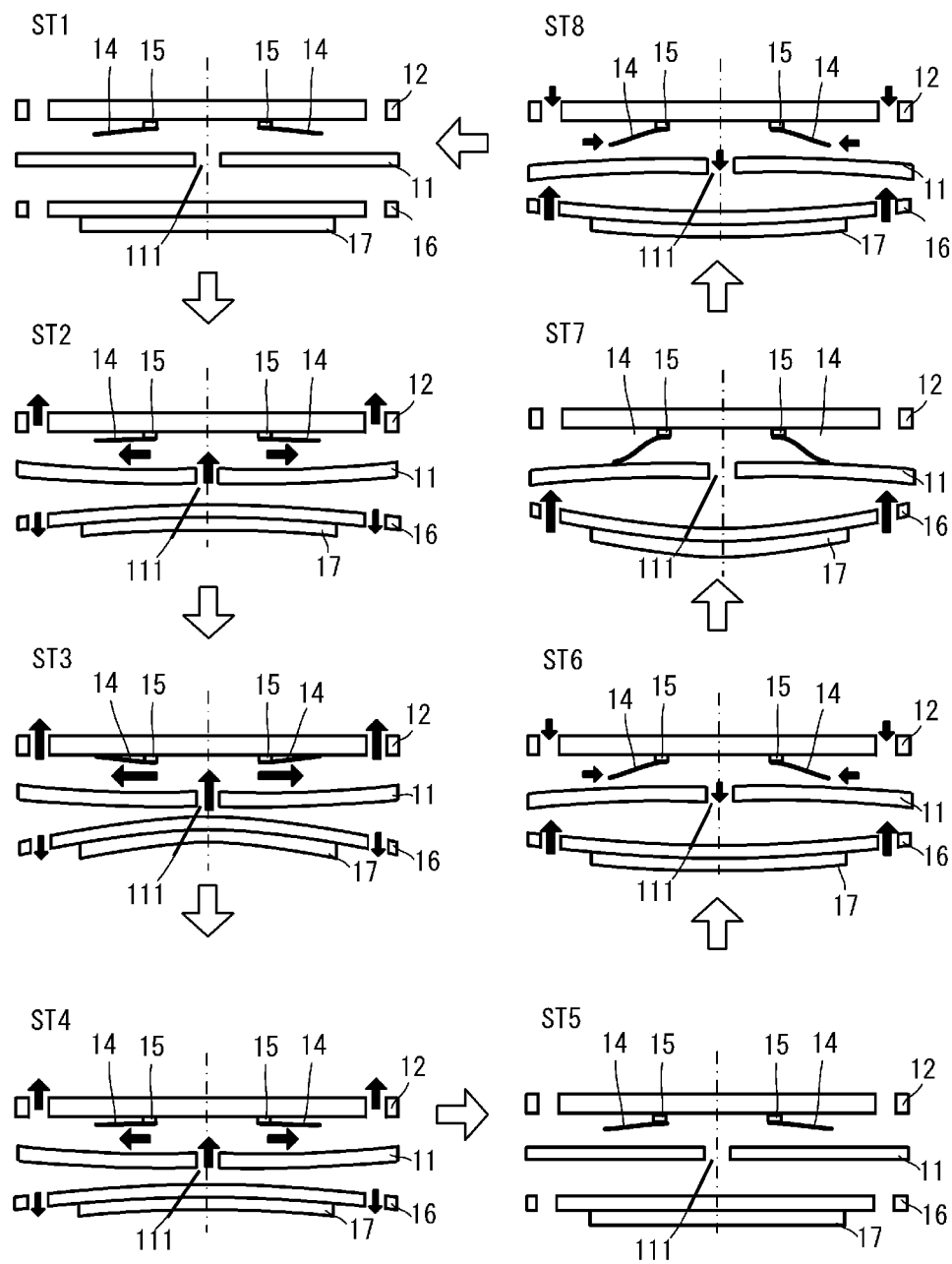
FIG. 4 is a diagram schematically illustrating an operation of the fluid control device 10.

More specifically, the fluid control device 10 periodically repeats the operation illustrated in FIG. 4. The arrows in the respective states (ST1 to ST8) in FIG. 4 schematically indicate the flow direction and the flow rate of the fluid. In this periodic operation, the film valve 14 does not come into contact with the first vent hole 111 and the second vent holes 121. Therefore, the abrasion and breakage of the film valve 14 are unlikely to occur.

In addition, in the configuration of the present embodiment, the first vent hole 111 is arranged in the central region of the first main plate 11. With this, the first vent hole 111 is arranged in a region where volume change, that is, pressure change, in the pump chamber 125 is large. Therefore, it is possible to operate the film valve 14 with a large pressure change, and the flow-rectifying effect is improved.

In addition, in the configuration of the present embodiment, the inner end side (central region side) of the film valve 14 is fixed. With this, the film valve 14 deforms toward the first main plate 11 side during the period in which the first main plate 11, and the second main plate 12 approach each other due to the vibration of the first main plate 11. Therefore, the film valve 14 easily contacts the first main plate 11, and it is possible to quickly realize the separation state. As the result, the flow-rectifying function by the film valve 14 is improved.

In the present embodiment, the aspect in which the inner end of the film valve 14 is fixed by the bonding member 15 has been described, but the inner end of the film valve 14 and the side surface of the bonding member 15 need not be flush with each other. That is, the film valve 14 may be bonded to the second main plate 12 by the bonding member 15 at a position shifted from the inner end toward the outer end side of the film valve 14.

Second Embodiment

Figure 5:
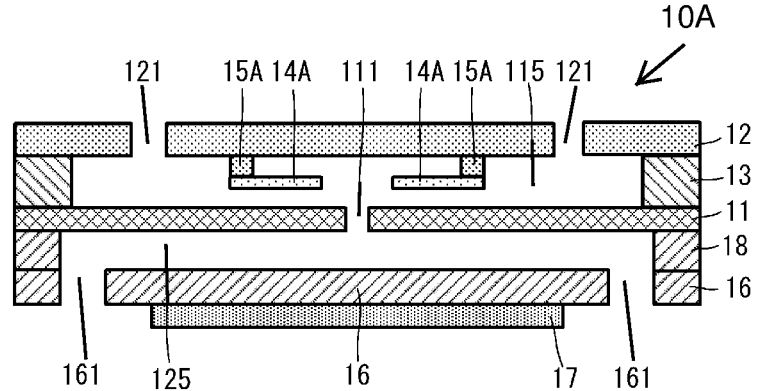
FIG. 5 is a sectional view illustrating a configuration of a fluid control device 10A according to a second embodiment of the present disclosure.

A fluid control device according to a second embodiment of the present disclosure will be described with reference to the drawings. FIG. 5 is a sectional view illustrating a configuration of a fluid control device 10A according to the second embodiment of the present disclosure.

As illustrated in FIG. 5, the fluid control device 10A according to the second embodiment differs from the fluid control device 10 according to the first embodiment in the fixing structure of a film valve 14A. The other configuration of the fluid control device 10A is similar to that of the fluid control device 10, and a description of the same portions will be omitted.

The film valve 14A has a configuration similar to that of the film valve 14. The portion of the film valve 14A with a predetermined width in the outer end side of an annular shape is bonded to the second main plate 12 by a bonding member 15A, and the region in the inner end side thereof is not bonded. With this, the film valve 14A is bonded to the second main plate 12 in a state in which the region with a predetermined area in the inner end side thereof is capable of vibrating.

Figure 6A:
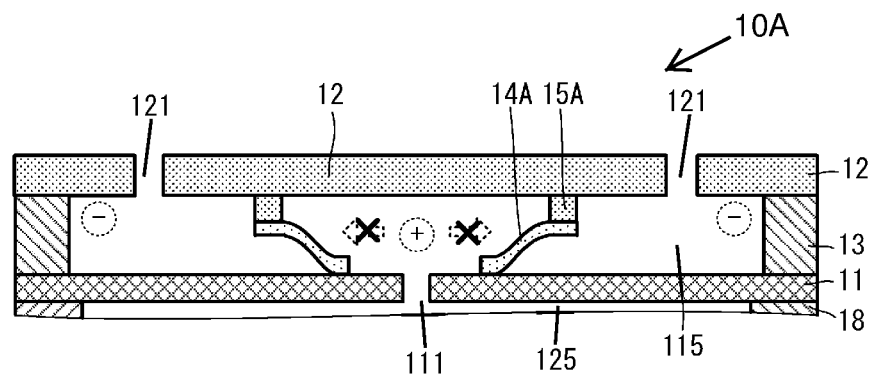
FIG. 6A and FIG. 6B are enlarged sectional views illustrating an operation of a film valve 14A.
Figure 6B:
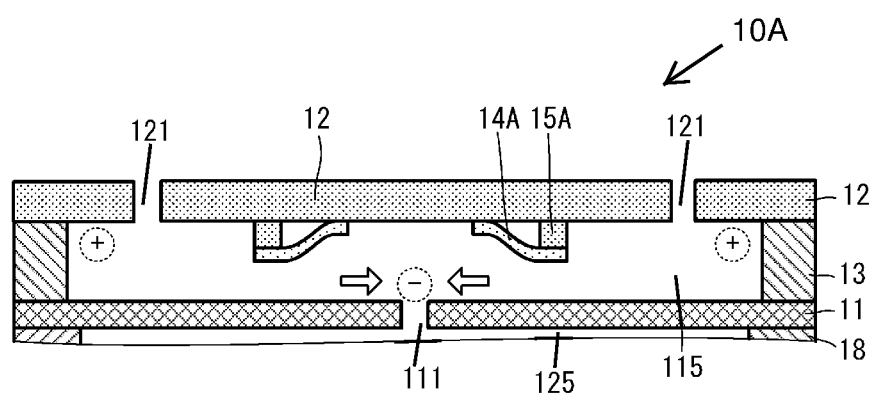

In the configuration above, the film valve 14A operates as follows in accordance with the flexural vibration of the diaphragm 16. FIG. 6A and FIG. 6B are enlarged sectional views illustrating the operation of the film valve 14A. In FIG. 6A and FIG. 6B, the displacement of the first main plate 11 is not illustrated.

(Central Region: Relatively High Pressure, Outer End Region: Relatively Low Pressure)

During the movement of the diaphragm 16 toward the pump chamber 125 side, that is, the period during which the diaphragm 16 and the first main plate 11 are approaching each other, the pressure in the vicinity of the first vent hole 111 increases. Consequently, as illustrated in FIG. 6A, the central region of the valve chamber 115 in plan view has a pressure (relatively high pressure) higher than that of the outer end region of the valve chamber 115.

In this case, as illustrated in FIG. 6A, the region in the inner end side of the film valve 14A curves toward the first main plate 11 side, and contacts the surface of the first main plate 11. As the result, the central region and the outer end region of the valve chamber 115 are separated. Therefore, the backflow of the fluid from the central region toward the outer end side of the valve chamber 115 is suppressed, and the fluid in the pump chamber 125 flows out through the third vent holes 161 to the outside. The flow rate of the fluid flowing out from the third vent holes 161 in the period above is larger than the flow rate of the fluid flowing into the pump chamber 125 through the third vent holes 161 in the period illustrated in FIG. 6B described later.

(Central Region: Relatively Low Pressure, Outer End Region: Relatively High Pressure)

During the movement of the diaphragm 16 toward the opposite side of the pump chamber 125, that is, the period during which the diaphragm 16 and the first main plate 11 are spaced apart from each other, the pressure in the vicinity of the first vent hole 111 lowers. Consequently, as illustrated in FIG. 6B, the central region of the valve chamber 115 in plan view has a pressure (relatively low pressure) lower than that of the outer end region of the valve chamber 115.

In this case, as illustrated in FIG. 6B, the region in the inner end side of the film valve 14A curves toward the second main plate 12 side, and is spaced apart from the first main plate 11. With this, the central region and the outer end region of the valve chamber 115 communicate with each other, and the fluid flowing in through the second vent holes 121 is conveyed from the outer end region toward the central region of the valve chamber 115.

At this time, since the film valve 14A is spaced apart from the first main plate 11, it does not hinder the conveyance of the fluid. In this period, the fluid flows in also through the third vent holes 161, but the flow rate of the fluid flowing in is smaller than the flow rate of the fluid flowing out from the third vent holes 161 in the period illustrated in FIG. 6A.

(Continuous Operation)

As described above, in the second vent holes 121, the outflow rate in the period illustrated in FIG. 6A is small, and the inflow rate in the period illustrated in FIG. 6B is large. Consequently, the fluid flows in through the second vent holes 121 by the continuous operation of the repetition of the period illustrated in FIG. 6A and the period illustrated in FIG. 6B.

On the other hand, in the third vent holes 161, the outflow rate in the period illustrated in FIG. 6A is large, and the inflow rate in the period illustrated in FIG. 6B is small. Consequently, the fluid flows out through the third vent holes 161 by the continuous operation of the repetition of the period illustrated in FIG. 6A and the period illustrated in FIG. 6B.

With this, the fluid flows in through the second vent holes 121 and flows out through the third vent holes 161 by the continuous operation of the repetition of the period illustrated in FIG. 6A and the period illustrated in FIG. 6B.

In this periodic operation, the film valve 14A does not come into contact with the first vent hole 111 and the second vent holes 121. Therefore, the abrasion and breakage of the film valve 14A are unlikely to occur.

Third Embodiment

Figure 7:
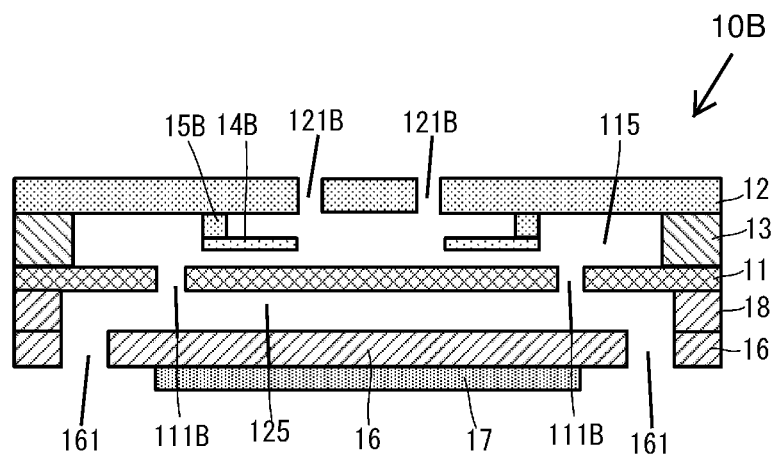
FIG. 7 is a sectional view illustrating a configuration of a fluid control device 10B according to a third embodiment of the present disclosure.

A fluid control device according to a third embodiment of the present disclosure will be described with reference to the drawings. FIG. 7 is a sectional view illustrating a configuration of a fluid control device 10B according to the third embodiment of the present disclosure.

As illustrated in FIG. 7, the fluid control device 10B according to the third embodiment differs from the fluid control device 10 according to the first embodiment in a first vent hole 111B, a second vent hole 121B, and a film valve 14B. The other configuration of the fluid control device 10B is similar to that of the fluid control device 10, and a description of the same portions will be omitted.

The plurality of first vent holes 111B is provided. The plurality of first vent holes 111B is arranged in an annular shape at equal distances from the center of the first main plate 11. The plurality of second vent holes 121B is provided. The plurality of second vent holes 121B is arranged in an annular shape at equal distances from the center of the second main plate 12.

The film valve 14B has a configuration similar to that of the film valve 14. The portion of the film valve 14B with a predetermined width in the outer end side of an annular shape is bonded to the second main plate 12 by a bonding member 15B, and the region in the inner end side thereof is not bonded. With this, the film valve 14B is bonded to the second main plate 12 in a state in which the region with a predetermined area in the inner end side thereof is capable of vibrating.

The plurality of second vent holes 121B is arranged in a region surrounded by the outer end of the film valve 14B in plan view, and the plurality of first vent holes 111B is arranged outside the region surrounded by the outer end of the film valve 14B in plan view.

Figure 8A:
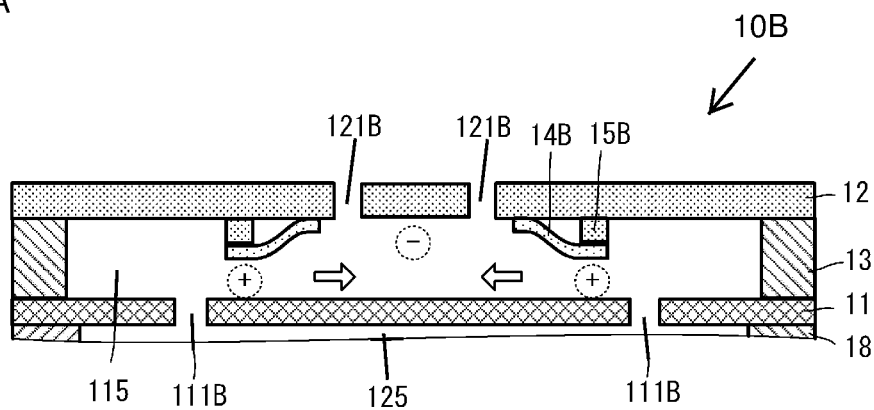
FIGS. 8A and 8B are enlarged sectional views illustrating an operation of a film valve 14B.
Figure 8B:
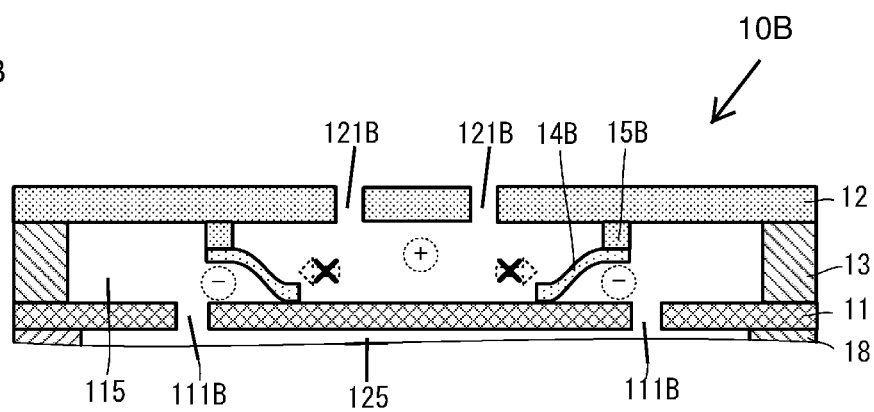

In the configuration above, the film valve 14B operates as follows in accordance with the flexural vibration of the diaphragm 16. FIG. 8A and FIG. 8B are enlarged sectional views illustrating the operation of the film valve 14B. In FIG. 8A and FIG. 8B, the illustration of the displacement of the diaphragm 16 is omitted.

(Central Region: Relatively Low Pressure, Outer End Region: Relatively High Pressure)

During the movement of the diaphragm 16 toward the pump chamber 125 side, that is, the period during which the diaphragm 16 and the first main plate 11 are approaching each other, the pressure in the vicinity of the first vent holes 111B increases. Consequently, as illustrated in FIG. 8A, the outer end region of the valve chamber 115 in plan view has a pressure (relatively high pressure) higher than that of the central region of the valve chamber 115.

In this case, as illustrated in FIG. 8A, the region in the inner end side of the film valve 14B curves toward the second main plate 12 side, and is spaced apart from the first main plate 11. With this, the central region and the outer end region of the valve chamber 115 communicate with each other, and the fluid in the outer end region is conveyed to the central region and is discharged from the second vent holes 121B.

At this time, since the film valve 14B is spaced apart from the first main plate 11, it does not hinder the conveyance of the fluid. Note that, although the fluid flows out through the third vent holes 161 in this period, the flow rate of the fluid flowing out is smaller than the flow rate of the fluid flowing in through the third vent holes 161 in the period of FIG. 8B which will be described later.

(Central Region: Relatively High Pressure, Outer End Region: Relatively Low Pressure)

During the movement of the diaphragm 16 toward the opposite side of the pump chamber 125, that is, the period during which the diaphragm 16 and the first main plate 11 are spaced apart from each other, the pressure in the vicinity of the first vent holes 111B lowers. Consequently, as illustrated in FIG. 8B, the central region of the valve chamber 115 in plan view has a pressure (relatively high pressure) higher than that of the outer end region of the valve chamber 115.

In this case, as illustrated in FIG. 8B, the region in the inner end side of the film valve 14B curves toward the first main plate 11 side, and contacts the surface of the first main plate 11. As the result, the central region and the outer end region of the valve chamber 115 are separated. Therefore, the backflow of the fluid from the central region toward the outer end side is suppressed, and the fluid flows in through the third vent holes 161 into the pump chamber 125. The flow rate of the fluid flowing in during this period is larger than the outflow rate from the third vent holes 161 in the period illustrated in FIG. 8A by the amount of decrease in the inflow through the first vent holes 111B.

(Continuous Operation)

As described above, in the second vent holes 121B, the outflow rate in the period illustrated in FIG. 8A is large, and the inflow rate in the period illustrated in FIG. 8B is small. Consequently, the fluid flows out through the second vent holes 121B by the continuous operation of the repetition of the period illustrated in FIG. 8A and the period illustrated in FIG. 8B.

On the other hand, in the third vent holes 161, the outflow rate in the period illustrated in FIG. 8A is small, and the inflow rate in the period illustrated in FIG. 8B is large. Consequently, the fluid flows in through the third vent holes 161 by the continuous operation of the repetition of the period illustrated in FIG. 8A and the period illustrated in FIG. 8B.

With this, the fluid flows in through the third vent holes 161 and flows out through the second vent holes 121B by the continuous operation of the repetition of the period illustrated in FIG. 8A and the period illustrated in FIG. 8B.

In the periodic operation, the film valve 14B does not come into contact with the first vent holes 111B and the second vent holes 121B. Therefore, the abrasion and breakage of the film valve 14B are unlikely to occur.

Note that, it is possible to use the following shapes as the above-described diaphragm, the first main plate, and the second main plate, for example. In the following, various shapes of the fluid control device 10 according to the first embodiment are illustrated, but various shapes may be employed for the fluid control device according to another embodiment using the same concept as the concept used in the first embodiment.

Figure 9A:
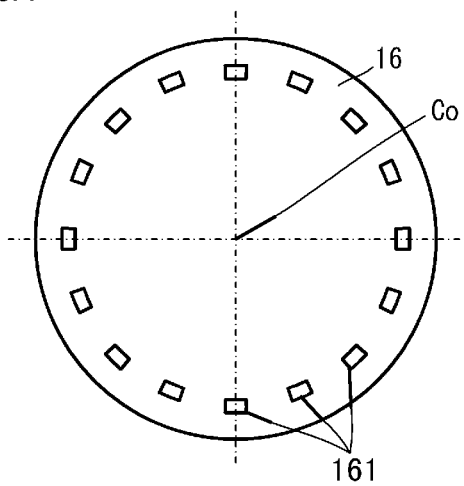
FIGS. 9A and 9B are plan views illustrating an example of a shape of a diaphragm 16.
Figure 9B:
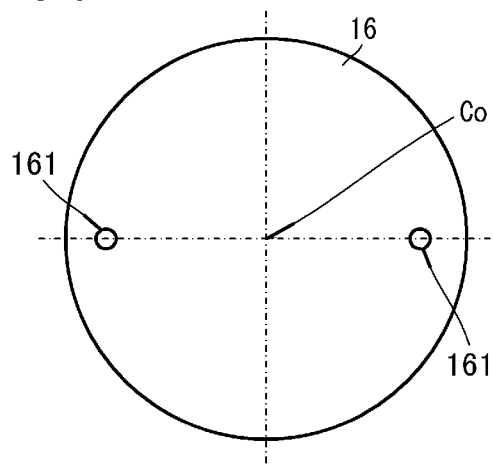

FIG. 9A and FIG. 9B are plan views illustrating examples of the shape of the diaphragm 16.

In the shape illustrated in FIG. 9A, 16 third vent holes 161 are formed. The 16 third vent holes 161 are arranged on a circumference at equal distances from the center Co of the diaphragm 16. In other words, the 16 third vent holes 161 are arranged in an annular shape with the center Co of the diaphragm 16 as a reference point. The 16 third vent holes 161 are arranged at predetermined intervals.

In the shape illustrated in FIG. 9B, two third vent holes 161 are formed. The two third vent holes 161 are arranged at equal distances from the center Co.

The number and the formation positions of the third vent holes 161 are not limited to those illustrated in FIG. 9A and FIG. 9B.

Figure 10A:
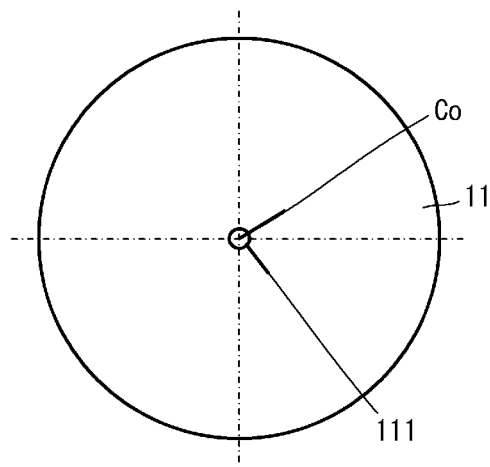
FIGS. 10A and 10B are plan views illustrating an example of a shape of a first main plate 11.
Figure 10B:
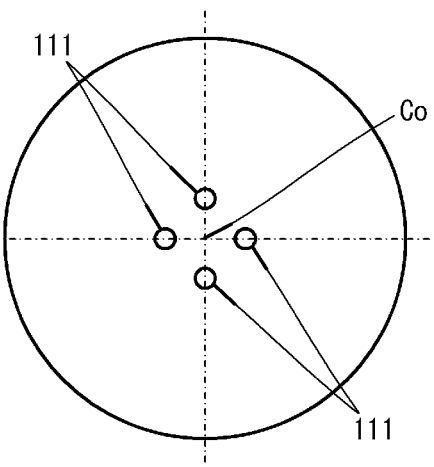

FIG. 10A and FIG. 10B are plan views illustrating examples of the shape of the first main plate 11.

In the shape illustrated in FIG. 10A, one first vent hole 111 is formed. The one first vent hole 111 is formed in the center Co of the first main plate 11.

In the shape illustrated in FIG. 10B, four first vent holes 111 are formed. The four first vent holes 111 are arranged on a circumference at equal distances from the center Co of the first main plate 11. It is preferable that the first vent hole 111 be arranged in the vicinity of the center Co of the first main plate 11.

The number and the formation positions of the first vent holes 111 are not limited to those illustrated in FIG. 10A and FIG. 10B.

Figure 11:
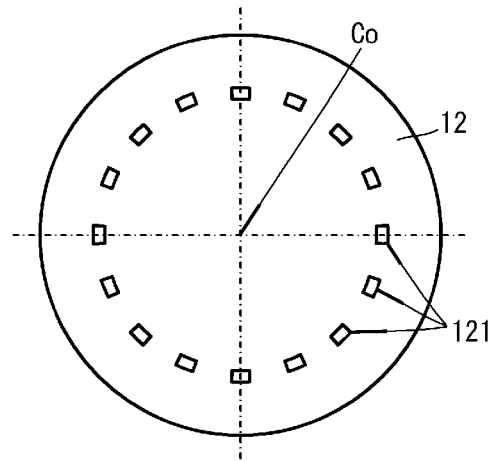
FIG. 11 is a plan view illustrating a shape of a second main plate 12.

FIG. 11 is a plan view illustrating the shape of the second main plate 12.

In the shape illustrated in FIG. 11, 16 second vent holes 121 are formed. The 16 second vent holes 121 are arranged on a circumference at equal distances from the center Co of the second main plate 12. In other words, the 16 second vent holes 121 are arranged in an annular shape at equal distances from the center Co of the second main plate 12. The 16 second vent holes 121 are arranged at predetermined intervals.

When the first vent holes 111 are shifted from the center Co, the diameter of the circle in which the second vent holes 121 are arranged is larger than the distance between the first vent holes 111 and the center Co (the diameter of the circle in the case where the first vent holes 111 are arranged in an annular shape).

The number and the formation positions of the second vent holes 121 are not limited to those illustrated in FIG. 11.

Further, the film valve may have an aspect in which a plurality of fan-shaped films is partially overlapped with each other and arranged over the entire circumference.

In the above description, the configuration in which the film valve is fixed to the second main plate is described, but it is also possible to fix the film valve to the first main plate.

In addition, in the above description, the flow-rectifying effect is generated by the aspect in which the film valve contacts and the aspect in which the film valve does not contact. Meanwhile, it is also possible to generate a flow-rectifying effect by controlling the flow path resistance or the like. The flow path resistance or the like is controlled by controlling the distance between the first main plate 11 and the second main plate 12 at the position where the film valve is disposed with the vibration of the film valve. However, it is possible to obtain a higher flow-rectifying effect by using the aspect in which the film valve contacts and the aspect in which the film valve does not contact.

(Modification)

Figure 12:
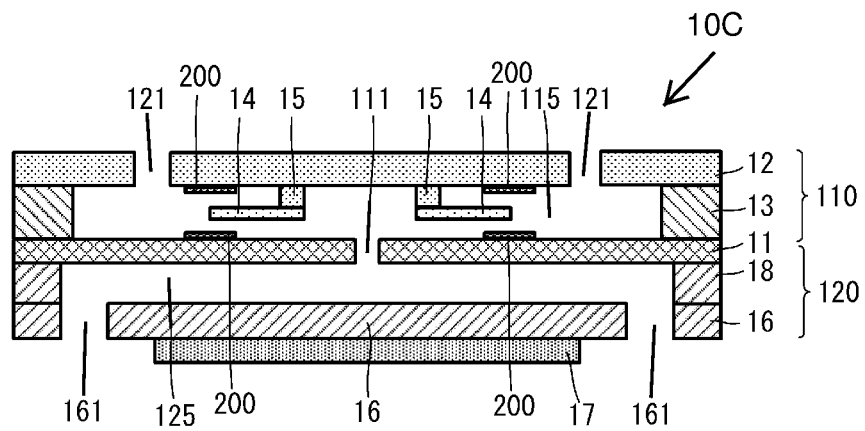
FIG. 12 is a sectional view illustrating a configuration of a fluid control device 10C according to a modification of the first embodiment of the present disclosure.

FIG. 12 is a sectional view illustrating a configuration of a fluid control device 10C according to a modification of the first embodiment of the present disclosure. The fluid control device 10C differs from the fluid control device 10 according to the first embodiment in that a coating agent 200 is applied. The other configuration of the fluid control device 10C is similar to that of the fluid control device 10, and a description of the same portions will be omitted.

As illustrated in FIG. 12, the coating agent 200 is applied to a region facing the movable range of the film valve 14 of the first main plate 11 and a region facing the movable range of the film valve 14 of the second main plate 12.

According to this configuration, it is possible to suppress the damage caused by the contact of the film valve 14 with the first main plate 11 and the second main plate 12.

Note that the main component of the coating agent 200 may be a resin having Young's modulus lower than that of the first main plate 11 and the second main plate 12, such as silicone rubber or PTFE. Since the coating agents above have low Young's modulus, impact when the film valve 14 is brought into contact with the first main plate 11 or the second main plate 12 is alleviated, and it is possible to suppress the damage to the film valve 14.

Note that it is further preferable that the coating agent 200 contain fluorine or molybdenum disulfide as a main component. Since the surfaces of these coating agents have lubricity, it is possible to suppress the damage of the film valve 14 due to friction with the first main plate 11 and the second main plate 12.

Note that it is possible to obtain the same effects when the coating agent 200 is applied to one of the first main plate 11 and the second main plate 12.

Note that the configuration of the above-described embodiments can be combined as appropriate, and the functions and effects corresponding to the respective combinations can be obtained.

ST1, ST2, ST3, ST4, ST5, ST6, ST7, ST8 STATE
10, 10A, 10B, 10C FLUID CONTROL DEVICE
11, 11B FIRST MAIN PLATE
12 SECOND MAIN PLATE
13 FIRST SIDE PLATE
14, 14A, 14B FILM VALVE
15, 15A, 15B BONDING MEMBER
16 DIAPHRAGM
17 PIEZOELECTRIC ELEMENT
18 SECOND SIDE PLATE
110 VALVE
111, 111B FIRST VENT HOLE
115 VALVE CHAMBER
120 PUMP
121, 121B SECOND VENT HOLE
125 PUMP CHAMBER
161 THIRD VENT HOLE
200 COATING AGENT

The invention claimed is:

1. A fluid control device comprising:
a valve including a first main plate, a second main plate, and a first side plate, and having a valve chamber, wherein one main surface of the second main plate faces one main surface of the first main plate, the first side plate connects the first main plate and the second main plate, and the valve chamber is comprised of the first main plate, the second main plate, and the first side plate, and wherein the first main plate has a first vent hole through which an inside and an outside of the valve chamber communicate with each other, and the second main plate has a second vent hole through which the inside and the outside of the valve chamber communicate with each other;
a pump including a diaphragm and a second side plate, and having a pump chamber, wherein the diaphragm is disposed to face another main surface of the first main plate, a piezoelectric element is disposed in the diaphragm, and the pump chamber is comprised of the first main plate, the diaphragm, and the second side plate, and wherein the pump chamber communicates with the valve chamber through the first vent hole; and
a valve body disposed in the valve chamber, wherein
when the one main surface of the second main plate is viewed from a front side of the one main surface of the first main plate,
the valve chamber includes a central region and an outer end region surrounding the central region,
the first vent hole is positioned in the central region and the second vent hole is positioned in the outer end region, or
the first vent hole is positioned in the outer end region of the valve chamber and the second vent hole is positioned in the central region of the valve chamber, and
the valve body is positioned between the first vent hole and the second vent hole,
the valve body is fixed to the first main plate or the second main plate in a state in which an end portion on a side of the outer end region or an end portion on a side of the central region is capable of vibrating, and
wherein the valve body is fixed to the first main plate or the second main plate at a fixed portion of the valve body, and wherein said fixed portion is not aligned with the first vent hole and the second vent hole in plan view.

2. The fluid control device according to claim 1, wherein a coating agent is applied to a region of the first main plate or the second main plate facing a movable range of the valve body.

3. The fluid control device according to claim 2, wherein the valve body has a shape allowing switching between an aspect in which the end portion capable of vibrating contacts the first main plate or the second main plate to which the valve body is not fixed and an aspect in which the end portion capable of vibrating does not contact the first main plate or the second main plate to which the valve body is not fixed in accordance with pressure change in the valve chamber.

4. The fluid control device according to claim 2, wherein the valve body has a shape allowing switching between an aspect in which the end portion capable of vibrating contacts the first main plate or the second main plate to which the valve body is not fixed and an aspect in which the end portion capable of vibrating does not contact the first main plate or the second main plate to which the valve body is not fixed in accordance with pressure change in the valve chamber.

5. The fluid control device according to claim 2, wherein the first vent hole is positioned in the central region, and the second vent hole is positioned in the outer end region.

6. The fluid control device according to claim 2, wherein the valve body is fixed to the first main plate or the second main plate in a state that the end portion on the side of the central region or the outer end region where the second vent hole is positioned is capable of vibrating.

7. The fluid control device according to claim 2, wherein a Young's modulus of the coating agent is lower than each of Young's moduluses of the first main plate and the second main plate.

8. The fluid control device according to claim 7, wherein the valve body has a shape allowing switching between an aspect in which the end portion capable of vibrating contacts the first main plate or the second main plate to which the valve body is not fixed and an aspect in which the end portion capable of vibrating does not contact the first main plate or the second main plate to which the valve body is not fixed in accordance with pressure change in the valve chamber.

9. The fluid control device according to claim 7, wherein the first vent hole is positioned in the central region, and the second vent hole is positioned in the outer end region.

10. The fluid control device according to claim 7, wherein the valve body is fixed to the first main plate or the second main plate in a state that the end portion on the side of the central region or the outer end region where the second vent hole is positioned is capable of vibrating.

11. The fluid control device according to claim 1, wherein the valve body has a shape allowing switching between an aspect in which the end portion capable of vibrating contacts the first main plate or the second main plate to which the valve body is not fixed and an aspect in which the end portion capable of vibrating does not contact the first main plate or the second main plate to which the valve body is not fixed in accordance with pressure change in the valve chamber.

12. The fluid control device according to claim 11,
wherein the first vent hole is positioned in the central region, and the second vent hole is positioned in the outer end region.

13. The fluid control device according to claim 11,
wherein the valve body is fixed to the first main plate or the second main plate in a state that the end portion on the side of the outer end region where the second vent hole is positioned is capable of vibrating.

14. The fluid control device according to claim 11,
wherein a length of a portion of the valve body capable of vibrating in a direction extending from the central region to the outer end region is larger than a distance between the first main plate and the second main plate.

15. The fluid control device according to claim 14,
wherein the first vent hole is positioned in the central region, and the second vent hole is positioned in the outer end region.

16. The fluid control device according to claim 14,
wherein the valve body is fixed to the first main plate or the second main plate in a state that the end portion on the side of the outer end region where the second vent hole is positioned is capable of vibrating.

17. The fluid control device according to claim 1,
wherein the valve body is fixed to the first main plate or the second main plate in a state that the end portion on the side of the outer end region where the second vent hole is positioned is capable of vibrating.

18. The fluid control device according to claim 1,
wherein the valve body has an annular shape.

19. The fluid control device according to claim 1, wherein the valve body is radially aligned with the first side plate and is separated therefrom by a radially spaced distance.

20. The fluid control device according to claim 1, wherein the valve body is not aligned with the first vent hole and the second vent hole in plan view.

21. A fluid control device comprising:
a valve including a first main plate, a second main plate, and a first side plate, and having a valve chamber, wherein one main surface of the second main plate faces one main surface of the first main plate, the first side plate connects the first main plate and the second main plate, and the valve chamber is comprised of the first main plate, the second main plate, and the first side plate, and wherein the first main plate has a first vent hole through which an inside and an outside of the valve chamber communicate with each other, and the second main plate has a second vent hole through which the inside and the outside of the valve chamber communicate with each other;
a pump including a diaphragm and a second side plate, and having a pump chamber, wherein the diaphragm is disposed to face another main surface of the first main plate, a piezoelectric element is disposed in the diaphragm, and the pump chamber is comprised of the first main plate, the diaphragm, and the second side plate, and wherein the pump chamber communicates with the valve chamber through the first vent hole; and
a valve body disposed in the valve chamber, wherein
when the one main surface of the second main plate is viewed from a front side of the one main surface of the first main plate,
the valve chamber includes a central region and an outer end region surrounding the central region,
the first vent hole is positioned in the central region and the second vent hole is positioned in the outer end region, or
the first vent hole is positioned in the outer end region of the valve chamber and the second vent hole is positioned in the central region of the valve chamber, and
the valve body is positioned between the first vent hole and the second vent hole,
the valve body is fixed to the first main plate or the second main plate in a state in which an end portion on a side of the outer end region or an end portion on a side of the central region is capable of vibrating, and
wherein the first vent hole is positioned in the central region, and the second vent hole is positioned in the outer end region.

22. The fluid control device according to claim 21,
wherein the valve body is fixed to the first main plate or the second main plate in a state that the end portion on the side of the outer end region where the second vent hole is positioned is capable of vibrating.

* * * * *